United States Patent [19]
Haddad et al.

[11] Patent Number: 5,875,130
[45] Date of Patent: Feb. 23, 1999

[54] METHOD FOR PROGRAMMING FLASH ELECTRICALLY ERASABLE PROGRAMMABLE READ-ONLY MEMORY

[75] Inventors: Sameer S. Haddad, San Jose; Wing H. Leung, Campbell; John Chen, Cupertino; Ravi S. Sunkavalli, Santa Clara; Ravi P. Gutala, Milpitas, all of Calif.; Jonathan S. Su, Evanston, Ill.; Vei-Han Chan, San Jose; Colin S. Bill, Cupertino, both of Calif.

[73] Assignee: Advanced Micro Devices, San Jose, Calif.

[21] Appl. No.: 85,705

[22] Filed: May 27, 1998

[51] Int. Cl.$^6$ .................................................. G11C 13/00
[52] U.S. Cl. ...................................... 365/185.33; 365/218
[58] Field of Search ................................ 365/185.33, 218

[56] References Cited

U.S. PATENT DOCUMENTS

5,642,311  6/1997  Cleveland et al. ..................... 365/185.3

Primary Examiner—Terrell W. Fears
Attorney, Agent, or Firm—David G. Alexander

[57] ABSTRACT

A flash Electrically-Erasable Programmable Read-Only Memory (EEPROM) includes a semiconductor substrate, and a plurality of field effect transistor memory cells each having a source, drain, floating gate and control gate formed on the substrate. A controller controls a power source to apply an operational pulse to the drain of a cell, and apply a source to substrate bias voltage to the cell while the operational pulse is being applied thereto, the bias voltage having a value selected to reduce or substantially eliminate leakage current in the cell. The operational pulse can be an overerase correction pulse. In this case, a voltage which is substantially equal to the bias voltage is applied to the control gate for the duration of the overerase correction pulse. The operational pulse can also be a programming pulse. In this case, a voltage which is higher than the bias voltage is applied to the control gate of the selected wordline for the duration of the programming pulse. The bias voltage is preferably applied during both the overerase correction and programming pulses, reducing the power requirements and reducing the background leakage of the cells to a level at which program, read and overerase correction operations can be operatively performed.

33 Claims, 7 Drawing Sheets

METHOD FOR PROGRAMMING FLASH ELECTRICALLY ERASABLE PROGRAMMABLE READ-ONLY MEMORY

BACKGROUND OF THE INVENTION

1. Field of the Invention

The present invention generally relates to the art of microelectronic integrated circuits, and more specifically to a method for operating a flash Electrically Erasable Programmable Read-Only Memory (EEPROM).

2. Description of the Related Art

A microelectronic flash or block erase Electrically Erasable Programmable Read-Only Memory (Flash EEPROM) includes an array of cells which can be independently programmed and read. The size of each cell and thereby the memory are made small by omitting select transistors which would enable the cells to be erased independently. All of the cells are erased together as a block.

A memory of this type includes individual Metal-Oxide-Semiconductor (MOS) field effect transistor memory cells, each of which includes a source, drain, floating gate and control gate to which various voltages are applied to program the cell with a binary 1 or 0, or erase all of the cells as a block.

The cells are connected in a rectangular array of rows and columns, with the control gates of the cells in a row being connected to a respective wordline and the drains of the cells in a column being connected to a respective bitline. The sources of the cells are connected together. This arrangement is known as a NOR memory configuration.

A cell is programmed by applying, typically, 9 V to the control gate, 5 V to the drain and grounding the source, which causes hot electrons to be injected from the drain depletion region into the floating gate. Upon removal of the programming voltages, the injected electrons are trapped in the floating gate and create a negative charge therein which increases the threshold voltage of the cell to a value in excess of approximately 4 V.

The cell is read by applying typically 5 V to the control gate, 1 V to the bitline to which the drain is connected, grounding the source, and sensing the bitline current. If the cell is programmed and the threshold voltage is relatively high (4 V), the bitline current will be zero or at least relatively low. If the cell is not programmed or erased, the threshold voltage will be relatively low (2 V), the control gate voltage will enhance the channel, and the bitline current will be relatively high.

A cell can be erased in several ways. In one arrangement, a cell is erased by applying typically 12 V to the source, grounding the control gate and allowing the drain to float. This causes the electrons which were injected into the floating gate during programming to be removed by Fowler-Nordheim tunneling from the floating gate through the thin tunnel oxide layer to the source. Alternatively, a cell can be erased by applying a negative voltage on the order of −10 V to the control gate, applying 5 V to the source and allowing the drain to float.

A problem with the conventional flash EEPROM cell arrangement is that due to manufacturing tolerances, some cells become over-erased before other cells become erased sufficiently. The floating gates of the over-erased cells are depleted of electrons and become positively charged. This causes the over-erased cells to function as depletion mode transistors which cannot be turned off by normal operating voltages applied to their control gates, and introduces leakage during subsequent program and read operations.

More specifically, during program and read operations only one wordline which is connected to the control gates of a row of cells is held high at a time, while the other wordlines are grounded. However, a positive voltage is applied to the drains of all of the cells. If the threshold voltage of an unselected cell is zero or negative, leakage current will flow through the source, channel and drain of the cell.

Figure 1:
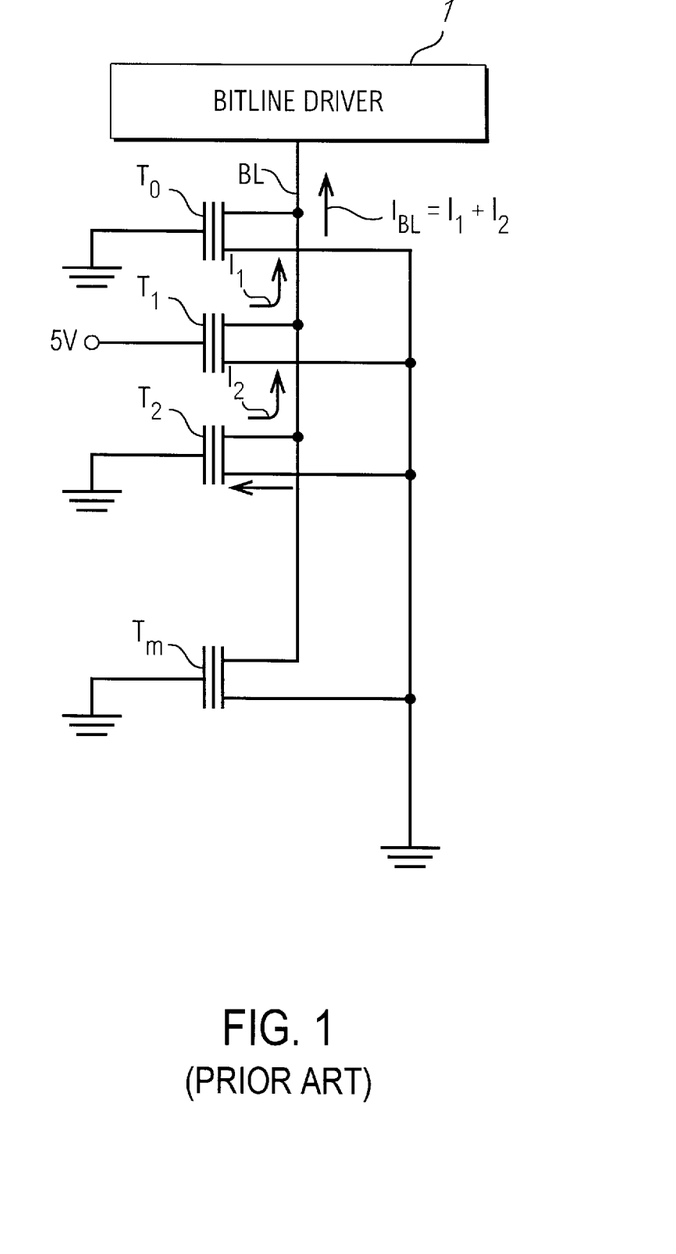
FIG. 1 is a simplified electrical schematic diagram showing how background leakage current is generated in a prior art flash Electrically Erasable Programmable Read-Only Memory (EEPROM)

This undesirable effect is illustrated in FIG. 1. The drains of a column of floating gate cell transistors $T_0$ to $T_m$ are connected to a bitline BL, which is itself connected to a bitline driver 1. The sources of the transistors $T_0$ to $T_m$ are typically connected to ground. One of the transistors $T_0$ to $T_m$ is selected for a program or read operation by applying a positive voltage, e.g. 5 V, to its control gate which turns on the transistor. The control gates of the unselected transistors are connected to ground.

As viewed in FIG. 1, 5 V is applied to the transistor $T_1$ which turns it on. A current $I_1$ flows through the transistor $T_1$ from ground through its source, channel (not shown) and drain and through the bitline BL to the driver 1. Ideally, the bitline current $I_{BL}$ should be equal to $I_1$.

However, if one or more of the unselected transistors, e.g. the transistor $T_2$ as illustrated in FIG. 1, is overerased, its threshold voltage will be zero or negative, and background leakage current will flow through the transistor $T_2$ as indicated at $I_2$. The bitline current $I_{BL}$ is now no longer equal to $I_1$, but is equal to the sum of $I_1$ and the background leakage current $I_2$.

In a typical flash EEPROM, the drains of a large number, for example 512, transistor cells such as illustrated in FIG. 1 are connected to each bitline (column). If a substantial number of cells on the bitline are drawing background leakage current, the total leakage current on the bitline can exceed the cell read current. This makes it impossible to read the state of a cell on the bitline and renders the memory inoperative.

Figure 2:
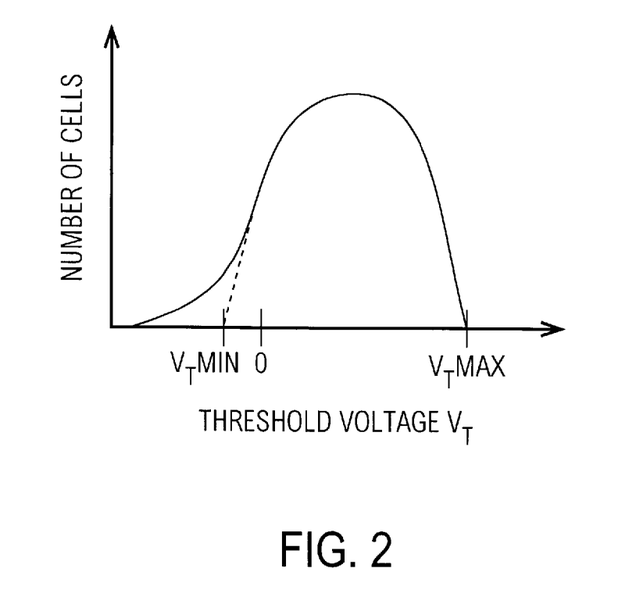
FIG. 2 is a graph illustrating a threshold voltage distribution in a flash EEPROM after an erase operation.

FIG. 2 illustrates how the threshold voltages of the cells or bits in a flash EEPROM can differ substantially from each other following an erase operation as shown by a solid line curve which represents the numbers of cells having particular values of threshold voltage $V_T$. It will be seen that the least erased cells will have a relatively high threshold voltage $V_T$MAX, whereas the most overerased cells will have a low threshold voltage which is below a minimum acceptable value $V_T$MIN that can be negative. The characteristic illustrated in FIG. 2 is known as the threshold voltage distribution.

Figure 3:
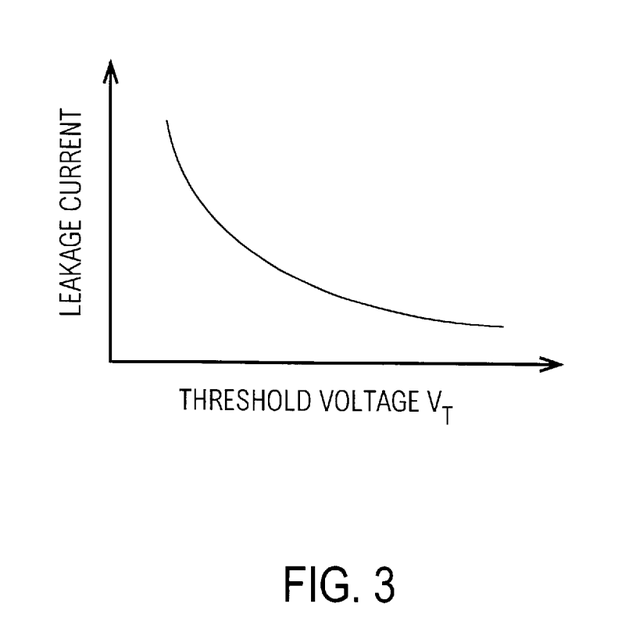
FIG. 3 is a graph illustrating how background leakage current varies as a function of threshold voltage for the least erased cells.

FIG. 3 illustrates how the background leakage current of a cell varies as a function of threshold voltage. The lower (more negative) the threshold voltage, the higher the leakage current. It is therefore desirable to prevent cells from being overerased and reduce the threshold voltage distribution to as low a range as possible, with ideally all cells having the same high threshold voltage after erase on the order of 2 V.

It is known in the art to reduce the threshold voltage distribution by performing an overerase correction operation which reprograms the most overerased cells to a higher threshold voltage. This operation will result in the threshold voltage curve being altered to the shape indicated by broken line in FIG. 2 in which the threshold voltages of all of the cells are above the minimum acceptable value $V_T$MIN. An overerase correction operation of this type is generally known as Automatic Programming Disturb (APD)

A preferred APD method which is referred to as Automatic Programming Disturb Erase (APDE) is disclosed in U.S. Pat. No. 5,642,311, entitled "OVERERASE CORRECTION FOR FLASH MEMORY WHICH LIMITS OVERERASE AND PREVENTS ERASE VERIFY ERRORS", issued Jun. 24, 1997 to Lee Cleveland. This patent is assigned to the same assignee as the present invention and is incorporated herein by reference in its entirety. The method includes sensing for overerased cells and applying programming pulses thereto which bring their threshold voltages back up to acceptable values.

Following application of an erase pulse, undererase correction is first performed on a cell-by cell basis by rows. The cell in the first row and column position is addressed and erase verified by applying 4 V to the control gate (wordline), 1 V to the drain (bitline), grounding the source, and using sense amplifiers to sense the bitline current and thereby determine if the threshold voltage of the cell is above a value of, for example, 2 V. If the cell is undererased (threshold voltage above 2 V), the bitline current will be low. In this case, an erase pulse is applied to all of the cells, and the first cell is erase verified again.

After application of each erase pulse and prior to a subsequent erase verify operation, overerase correction is performed on all of the cells of the memory. Overerase verify is performed on the bitlines of the array in sequence. This is accomplished by grounding the wordlines, applying typically 1 V to address the first bitline, and sensing the bitline current. If the current is above a predetermined value, this indicates that at least one of the cells connected to the bitline is overerased and is drawing leakage current. In this case, an overerase correction pulse is applied to the bitline. This is accomplished by applying approximately 5 V to the bitline for a predetermined length of time such as 100 µs.

After application of the overerase correction pulse the bitline is verified again. If bitline current is still high indicating that an overerased cell still remains connected to the bitline, another overerase correction pulse is applied. This procedure is repeated for all of the bitlines in sequence.

The procedure is repeated as many times as necessary until the bitline current is reduced to the predetermined value which is lower than the read current. Then, the procedure is performed for the rest of the cells in the first row and following rows until all of the cells in the memory have been erase verified.

By performing the overerase correction procedure after each erase pulse, the extent to which cells are overerased is reduced, improving the endurance of cells. Further, because overerased cells are corrected after each erase pulse, bitline leakage current is reduced during erase verify, thus preventing undererased cells from existing upon completion of the erase verify procedure.

Although the APDE method is effective in eliminating overerased cells, it is limited in that since the sources and wordlines (control gates) of the cells are grounded during overerase correction, overerased cells will draw background leakage current while the overerase correction pulses are being applied. The leakage current requires the provision of a large power supply. In addition, background leakage current is also present during programming and creates similar problems.

These problems are exacerbated as the supply voltage $V_{cc}$ is reduced in step with the reduction of feature sizes of EEPROMs. The threshold voltages of the erased cells must be reduced to accommodate the lower values of $V_{cc}$. This results in more cells in the low threshold voltage portion of the curve in FIG. 2 drawing leakage current.

In a sufficiently low $V_{CC}$ application, so many cells will draw leakage current that the total bitline leakage current during erase verify can exceed the value corresponding to an erased cell, even if the cell being verified is undererased. This makes it impossible to determine the state of a cell during erase verify and read, and renders the memory inoperative. This problem has remained unsolved in the prior art and has severely hindered the development of reduced voltage EEPROMs.

Another undesirable effect which becomes especially problematic at low values of $V_{cc}$ is that if $V_{cc}$ is applied directly to a wordline, it will be insufficient to enhance the channel of a selected cell such that a verify operation can be performed during erase. For this reason, a booster is provided to boost the wordline voltage to a value which is sufficiently higher than $V_{cc}$ that cell verification can be reliably performed. For a value of $V_{cc}$=3 V, the wordline voltage is typically boosted to a value of approximately 4–5 V.

Voltages are applied to bitlines through pass transistors which enable individual bitline selection. The background leakage current loads down the charge pump and increases the voltage drop across the pass transistors, resulting in a lower drain voltage being applied to the cells. If the drain voltage becomes too low, which can result from excessive leakage current, the cell operation can become unstable and unreliable.

SUMMARY OF THE INVENTION

It is an object of the present invention to provide a method for operating a flash Electrically-Erasable Programmable Read-Only Memory (EEPROM) which overcomes the above described limitations of the prior art, and enables the supply voltage $V_{cc}$ of an EEPROM to be reduced to levels which have heretofore been unattainable.

More specifically, a flash Electrically-Erasable Programmable Read-Only Memory (EEPROM) includes a semiconductor substrate, and a plurality of field effect transistor memory cells each having a source, drain, floating gate and control gate formed on the substrate. A controller controls a power source to apply an operational pulse to the drain of a cell or cells, and apply a source to substrate bias voltage to the cell while the operational pulse is being applied thereto, the bias voltage having a value selected to reduce or substantially eliminate leakage current in the cell.

The operational pulse can be an overerase correction pulse. In this case, a voltage which is substantially equal to the bias voltage is applied to the control gate for the duration of the overerase correction pulse.

The operational pulse can also be a programming pulse. In this case, a voltage which is higher than the bias voltage is applied to the control gate for the duration of the programming pulse. The bias voltage is preferably applied during both the overerase correction and programming pulses, reducing the power requirements and reducing the background leakage of the cells to a level at which program, read and overerase correction operations can be operatively performed.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 4:
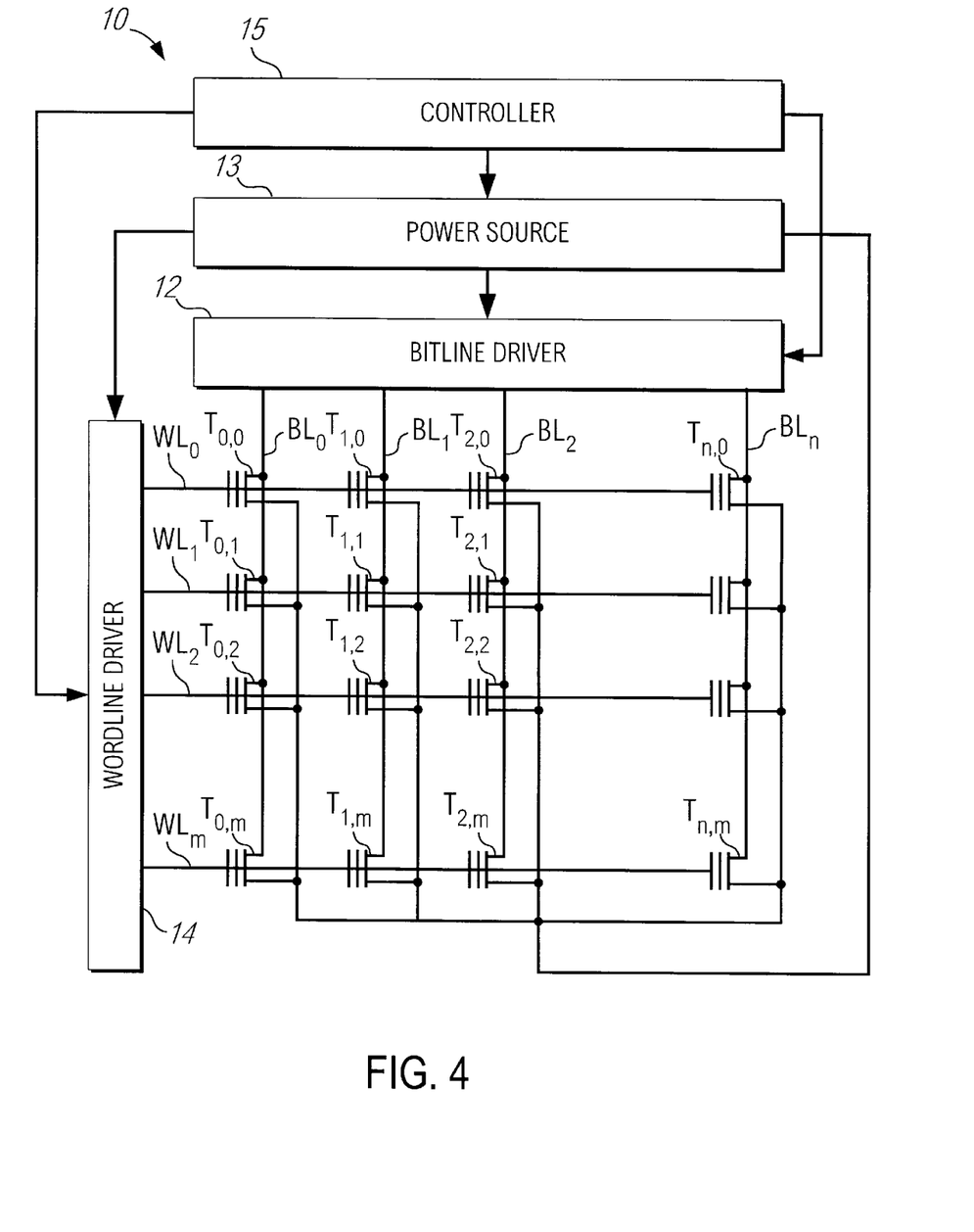
FIG. 4 is a simplified electrical schematic diagram of a flash EEPROM.

FIG. 4 illustrates the basic configuration of a NOR type flash Electrically Erasable Programmable Read-Only Memory (EEPROM) 10 to which the present invention is advantageously applied. The memory 10 comprises a plurality of core or memory cells which are arranged in a rectangular matrix or array of rows and columns. Each row is associated with a wordline, whereas each column is associated with a bitline.

Assuming that there are n columns and m rows, the bitlines are designated as $BL_0$ to $BL_n$ and the wordlines are designated as $WL_0$ to $WL_m$. Appropriate voltages are applied to the bitlines by a bitline driver 12, whereas appropriate voltages are applied to the wordlines by a wordline driver 14. The voltages applied to the drivers 12 and 14 are generated by a power source 13 under the control of a controller 15 which is typically on-chip logic circuitry. The controller 15 also controls the drivers 12 and 14 to address the memory cells individually or collectively as will be described below.

A memory cell is located at each junction of a wordline and a bitline. Each cell includes a Metal-Oxide-Semiconductor (MOS) Field-Effect Transistor (FET) having a source, drain, gate oxide and control gate. The cells of a flash EEPROM differ from conventional FETs in that they additionally include a floating gate and tunnel oxide layer disposed underneath the gate oxide and control gate.

The cells illustrated in FIG. 4 are designated using the notation $T_{n,m}$, where m is the row (wordline) number and n is the column (bitline) number. The control gates of the cells are connected to respective wordlines, and the drains of the cells are connected to respective bitlines as illustrated. The sources of all of the cells are connected to the power source 13.

A cell is programmed by applying, typically, 9 V to the control gate, 5 V to the drain and grounding the source, which causes hot electrons to be injected from the drain depletion region into the floating gate. Upon removal of the programming voltages, the injected electrons are trapped in the floating gate and create a negative charge therein which increases the threshold voltage of the cell to a value in excess of approximately 4 V.

The cell is read by applying typically 5 V to the control gate and 1 V to the bitline to which the drain is connected, grounding the source, and sensing the bitline current. If the cell is programmed and the threshold voltage is relatively high (4 V), the bitline current will be zero or at least relatively low. If the cell is not programmed or erased, the threshold voltage will be relatively low (2 V), the control gate voltage will enhance the channel, and the bitline current will be relatively high.

Reading, and verifying, as will be described below, are preferably performed using sense amplifiers and a reference current array as disclosed in the above referenced patent to Cleveland. The details of these elements are not the particular subject matter of the present invention.

A cell can be erased in several ways. In one arrangement, a cell is erased by applying typically 12 V to the source, grounding the control gate and allowing the drain to float. This causes the electrons which were injected into the floating gate during programming to be removed by Fowler-Nordheim tunneling from the floating gate through the thin tunnel oxide layer to the source. Alternatively, a cell can be erased by applying a negative voltage on the order of –10 V to the control gate, applying 5 V to the source and allowing the drain to float.

Figure 5:
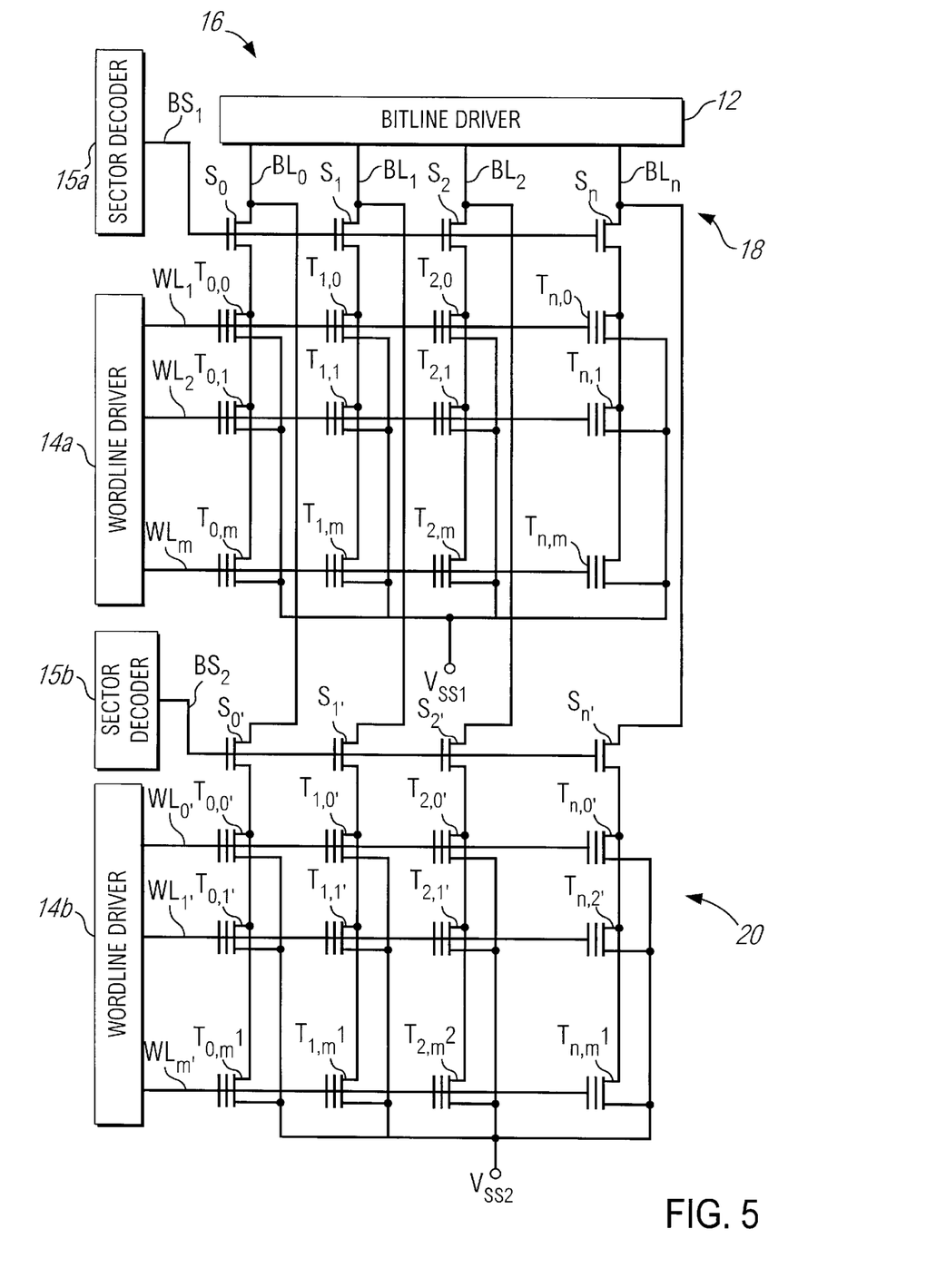
FIG. 5 is similar to FIG. 4 but illustrates a flash EEPROM having cells arranged in pages or banks.

FIG. 5 illustrates another flash EEPROM memory 16 which is similar to the memory 10 except that the cells are divided into a plurality, in the illustrated example two, of banks (also known as pages or sectors), each of which can be programmed, erased and read independently. The memory 16 includes a first cell bank 18 and a second cell bank 20. The memory cells in the first bank 18 are designated in the same manner as in FIG. 4, whereas a prime symbol is added to the designations of the cells in the second bank 20. The wordlines of the banks 18 and 20 are connected to separate wordline drivers 14a and 14b respectively.

In addition to the memory cells, each bank 18 and 20 includes a select transistor for each bitline. The select transistors for the banks 18 and 20 are designated as $S_0$ to $S_n$ and $s_0'$ to $S_n'$ respectively. The drains of the select transistors are connected to the respective bitlines, whereas the sources of the select transistors are connected to the drains of the transistors for the wordlines $WL_0$ to $WL_m$ and $WL_0'$ to $WL_m'$.

The select transistors differ from the memory cell transistors in that they are conventional MOSFETs and lack floating gates. The select transistors are switching elements rather than memory elements. The gates of the select transistors for the bank 18 are connected to a bank select output $BS_1$ of a sector decoder 15a, whereas the gates of the select transistors for the bank 20 are connected to a bank select output $BS_2$ of a sector decoder 15b.

The sources of the cells in bank 18 are connected to a common source supply voltage $V_{ss}1$, whereas the sources of the cells in the bank 20 are connected to a common source supply voltage $V_{ss}2$.

The bank 18 is selected by applying a logically high signal to the bank select line $BS_1$ which turns on the transistors $S_0$ to $S_n$ and connects the bitlines $BL_0$ to $BL_n$ to the underlying memory cells. The bank 18 is deselected by applying a logically low signal to the bank select line $BS_1$ which turns off the transistors $S_0$ to $S_n$ and disconnects the memory cells from the bitlines. The bank 20 is selected and deselected in an essentially similar manner using the bank select signal $BS_2$ and select transistors $S_0'$ to $S_n'$. The operation of the memory 16 is essentially similar to that of the memory 10, except that the program, erase and read operations are performed on the banks 18 and 20 sequentially and independently.

Figure 6:
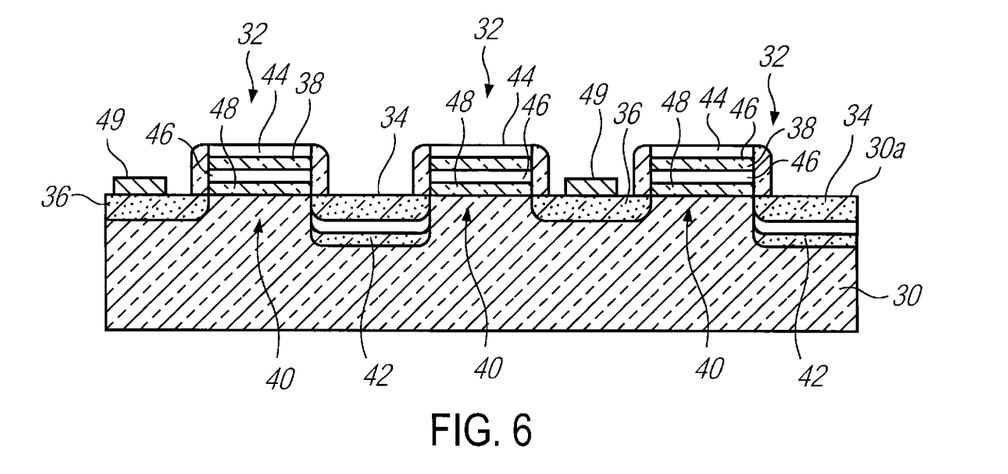
FIG. 6 is a simplified partial sectional view of a flash EEPROM illustrating the elements of the cells thereof.

FIG. 6 is a simplified sectional view illustrating the construction of the individual memory cells of the memory 10 or 16. The memory is formed on a silicon or other semiconductor substrate 30. Three erasable memory cells 32 are illustrated as being formed on a surface 30a of the substrate 30, each including a Metal-Oxide-Semiconductor (MOS) Field-Effect Transistor (FET) structure having a source 34, drain 36, an interdielectric layer 38, and channel 40 underlying a tunnel oxide layer 48. A polysilicon control gate 44 is formed over each gate oxide layer 38, and a polysilicon floating gate 46 and the tunnel oxide layer 48 are formed underneath the control gate 44 over the channel 40.

Each pair of cells 32 is arranged to share a common source 34 and drain 36. The sources 34 are connected to a common source line, whereas a bitline connection 49 is formed on each drain 36.

Figure 7:
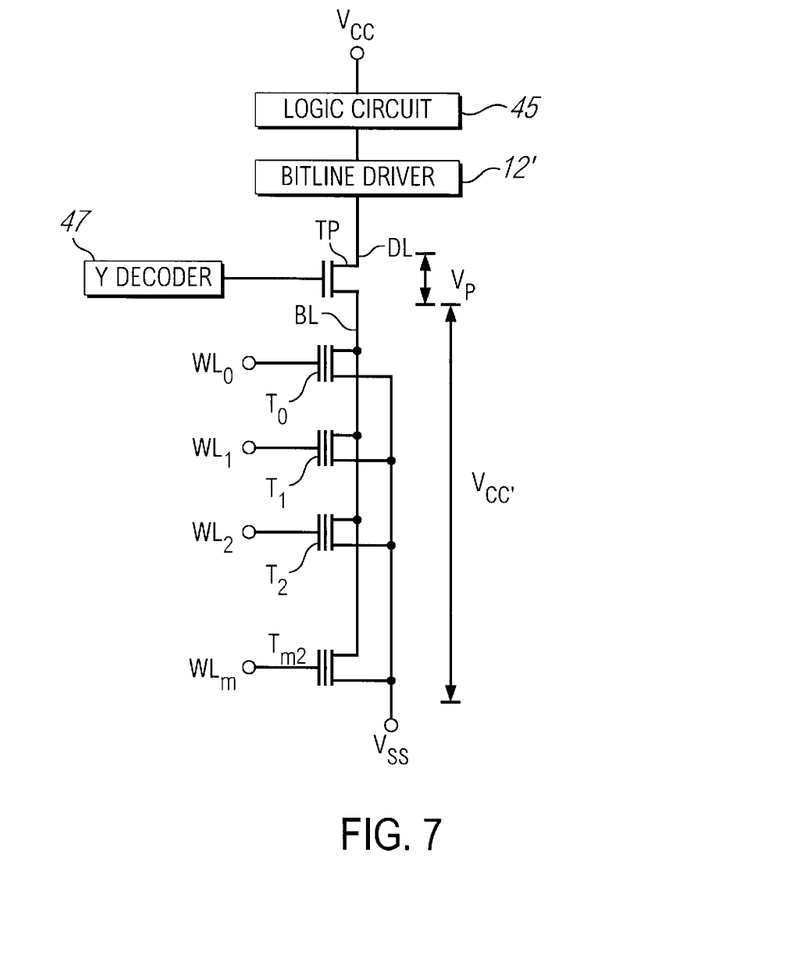
FIG. 7 is an electrical schematic diagram illustrating a voltage drop across a pass transistor for a bitline.

FIG. 7 illustrates how pass transistors can be connected in series with the bitlines in a flash EEPROM such as illustrated in FIGS. 3 and 4 for the purpose of programming and APDE. In this case, a bitline voltage is applied via a logic circuit 45 to a bitline driver 12' which outputs a logic signal on a data line DL to the drain of a conventional NMOS pass transistor TP. The source of the pass transistor TP is connected to the bitline BL, whereas the gate of the pass transistor TP is connected to the output of a Y decoder 47.

In an application in which $V_{cc}$ is sufficiently high, e.g. 5 V, to drive the bitline BL, the bitline driver 12' applies $V_{cc}$ to the data line DL. In an application in which $V_{cc}$ is lower than 5 V, for example 3 V, the bitline driver 12' connects the output of a charge pump (not shown), which generates a voltage that is higher than $V_{cc}$, preferably on the order of 4–5 V, to the data line DL.

The sources of transistors $T_0$ to $T_m$ are all connected to a source supply voltage $V_{ss}$ which is nominally 0 V. It will be noted that although only one pass transistor TP is illustrated in the drawing, a flash EEPROM can include two or more pass transistors connected in series, enabling bank or sector selection, etc. as described above with reference to FIG. 5.

The bitline BL is selected by controlling the Y decoder 47 to apply a logically high signal to the gate of the pass transistor TP which turns on the transistor TP. When the pass transistor TP is turned on, the drains of the cells $T_0$ to $T_m$ are connected through the transistor TP and the bitline driver 12' to the source voltage $V_{cc}$, or to the output of the charge pump in a low $V_{cc}$ application.

Although the bitline voltage is typically 4–5 V, there is a voltage drop $V_p$ across the pass transistor TP so that the actual voltage applied to the drains of the cells connected to the bitline BL has a value which is lower than the voltage on the data line DL by the voltage drop $V_p$.

For programming and APDE, the bitline voltage must be maintained above a certain value which depends on the characteristics of the cells in a particular application in order to prevent the operation of the cells from becoming unstable and unreliable due to insufficient horizontal electrical field. Typically the bitline voltage is always required to be above 4 V. If there is substantial background leakage, the increased drain current of the cells connected to the bitline BL will flow through the pass transistor TP and increase the voltage drop $V_p$. In a conventional flash EEPROM this increased voltage drop can bring the bitline voltage below 4 V and produce an unacceptable reduction in speed and/or other undesirable effects.

The method by which the present invention performs overerase correction and programming for a flash EEPROM and overcomes the problem of background leakage current as discussed above will now be described in detail. In the example presented in this disclosure the memory cells are assumed to be NMOS enhancement mode FETs. However, it will be understood that the invention is not so limited and that the scope thereof encompasses applying the principles described herein to other types and configurations including, for example, PMOS and/or depletion mode FETs in any combination.

The memory is erased by applying one or more erase pulses to all of the cells (or all of the cells in a bank or sector) of the memory. Then, undererase correction is performed on a column-by-column basis for each row. First, the cell in the first row and column position is addressed and erase verified by applying typically 4 V to the control gate (wordline), 1 V to the drain (bitline), grounding the source, and using sense amplifiers to sense the bitline current and thereby determine if the cell is undererased.

If the cell is undererased, the bitline current will be zero or at least relatively low. In this case, an erase pulse is applied to all of the cells, and the first cell is erase verified again.

This procedure is repeated as many times as necessary until the bitline current has been brought above a predetermined value corresponding to an erased cell. Then, the procedure is performed for the rest of the cells in the first row and following rows until all of the cells in the memory have been erase verified.

The present overerase correction procedure is preferably performed after the application of each erase pulse or pulse to the memory in accordance with the APDE method described above. However, it is further within the scope of the invention to perform the overerase correction procedure after all of the memory cells have been erased and erase verified in accordance with a prior art method.

The overerase correction procedure includes applying one or more overerase correction pulses to all of the cells of the memory, or alternatively to all of the cells in a bitline or sector (bank). The pulse or pulses are applied for a duration of time which is predetermined to achieve the desired result. The controller 15 controls the power source 13 for the duration of the overerase correction pulse(s) to apply a voltage to bitlines (drains of the cells) which is higher than the voltage applied to the wordlines (control gates) and to the sources of the cells.

The voltage applied to the bitlines is typically the conventional positive power supply voltage $V_{cc}$. A common value of $V_{cc}$ is 5 V, although the prevailing trend is toward lower values of $V_{cc}$ such as 3 V. In the latter case, as described above, an on-chip charge pump boosts the wordline voltage to approximately 4–5 V. Thus, the controller 15 controls the power source 13 to apply 4–5 V to all of the bitlines and thereby to the drains of all of the cells.

The control gates and sources of the cells are conventionally grounded (or at the same voltage as the substrate). However, a source bias on the order of 0.5 V higher than the substrate voltage is preferably applied to the sources of the cells to turn off background leakage current in accordance with the present invention.

In accordance with the "body effect", applying a source to substrate bias voltage (a bias voltage applied between the source and substrate of the cell) has the effect of increasing the threshold voltage of a field effect transistor. The present inventors have discovered that applying a small source bias voltage to the cells of a flash EEPROM has the effect of substantially cutting off background leakage current during application of the present overerase correction and programming pulses, or at least reducing the leakage current by a substantial amount.

The bias voltage is also applied to the control gates of the cells. This restores the vertical electric field in the cells which was reduced by the source bias voltage so that the APDE overerase correction speed is not reduced compared to the conventional method, and there is no background leakage.

Figure 8:
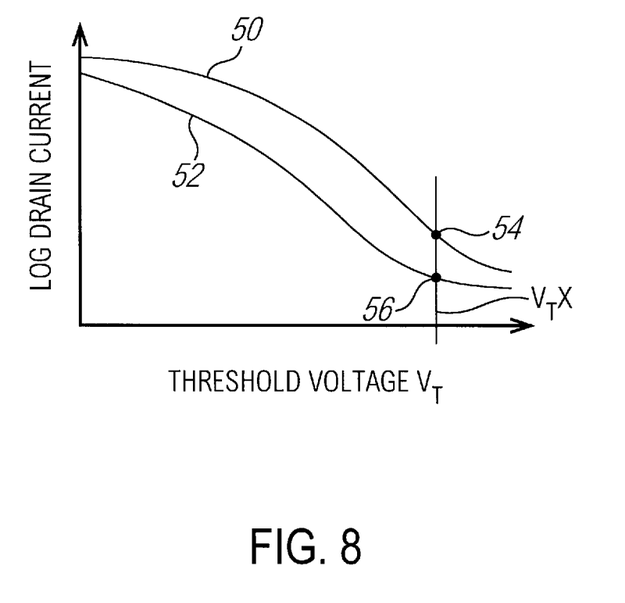
FIG. 8 is a graph illustrating how background leakage voltage is substantially eliminated in accordance with the invention.

FIG. 8 illustrates the logarithm of the drain current as a function of the threshold voltage of a cell during application of an overerase correction pulse. A curve 50 shows the relationship without source bias whereas a curve 52 shows the relationship with source and gate bias. The vertical or Y-axis represents the drain current as measured for two different source and gate bias conditions. The curve 50 represents both source and gate voltages at 0 V, whereas the curve 52 represents both source and gate voltages at 0.5 V. For comparison, the threshold voltages for the two curves were measured without source bias.

The curve 52 is shifted leftwardly as viewed in the drawing due to the increase in threshold voltage caused by the source bias. As such, the drawing illustrates that for a given value of threshold voltage, the drain current and thereby the background leakage current are reduced or substantially eliminated by the application of gate and source bias. For example, for a threshold voltage of $V_T X$, the drain current has a relatively high value without source bias as indicated at 54 and a negligibly low value with source bias as indicated at 56.

Reduction or elimination of background leakage current enables overerase correction (APD or APDE) and programming to be performed with reduced current requirements, and further enables overerase correction to be performed without reduction from a speed which is possible without background leakage. The invention is especially advantageous in low power supply voltage $V_{cc}$ applications (e.g. $V_{cc}$=3 V or less) in which the background leakage current has heretofore prevented APDE from being applied in a reliable manner as described above.

The present inventors have discovered that in the context of a flash EEPROM there is a particular value of source bias that will substantially shut off background leakage current, or at least reduce the leakage current to a manageable value, without reducing the programming speed (the speed at which the threshold voltage is increased) by overerase correction pulses. The actual value of source bias depends on the parameters of a particular application, and can be determined empirically, by computer simulation, or by a combination thereof.

As described above, the background leakage current is also present during programming in a conventional flash EEPROM. For this reason, a source bias voltage is also applied during the application of programming pulses. For programming, a voltage on the order of 9 V is applied to the control gate of a cell or cells being programmed. Since the unselected wordlines during programming are grounded, the source voltage needed to reduce the background leakage is less than during APDE.

The present inventors have determined that a source bias voltage on the order of 0.25 V is sufficient to substantially shut off background leakage current during programming. The source voltage of 0.25 V with the unselected wordlines grounded reduces the background leakage to the same level as during APDE with the gate and source biases at 0.5 V. However, this relationship may vary depending on the characteristics of a particular application.

Figure 9:
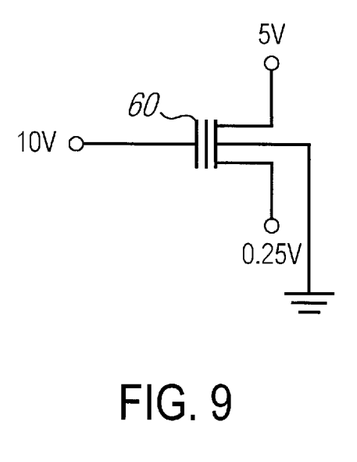
FIG. 9 is an electrical schematic diagram illustrating voltages applied to a memory cell during programming in accordance with the invention.
Figure 10:
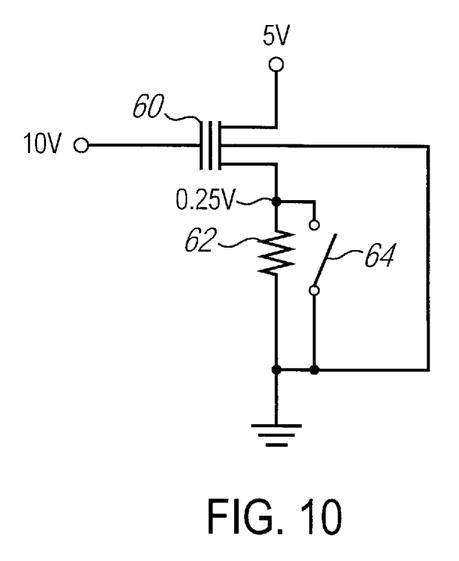
FIG. 10 is similar to FIG. 9 but illustrates an alternative arrangement.

The source bias can be applied in several ways in accordance with the present invention. FIG. 9 illustrates how the required voltages for programming can be directly applied to a memory cell 60 by the power source 13 via switching circuitry (not shown) which is controlled by the controller 15. FIG. 10 illustrates how the source bias can alternatively be generated by a resistor 62 which is connected between the source of the cell 60 and the substrate (ground). Current flow through the cell 60 and resistor 62 creates a voltage drop across the resistor 62 which appears at the source of the cell 60.

The value of the resistor 62 can be calculated using Ohm's Law as being equal to the desired source bias voltage divided by the cell drain current. When it is desired to connect the source directly to the substrate of the cell 60, the resistor 62 can be shorted out as symbolically indicated by a switch 64. The resistor 62 can be connected between the common source connection of the all of the cells and the substrate. Alternatively, a number of resistors can be connected between the common source connections of groups of cells and the substrate respectively.

Figure 11:
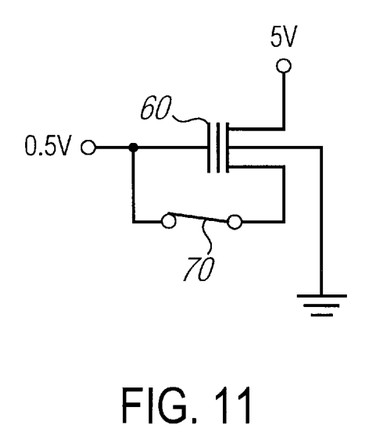
FIG. 11 is an electrical schematic diagram illustrating voltages applied to a memory cell during overerase correction in accordance with the invention.
Figure 12:
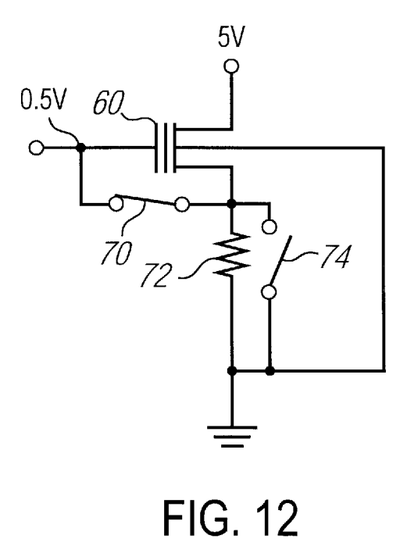
FIG. 12 is similar to FIG. 11 but illustrates an alternative arrangement.

FIGS. 11 and 12 similarly illustrate how a source and control gate bias voltage for overerase correction can be applied to a cell 60 either directly or generated across a resistor. In FIG. 11, a bias voltage of 0.5 V is applied either to the wordline or source of the cell, and the source and control gate are connected together as symbolically indicated by a switch 70. For operations in which different voltages are to be applied to the control gate and source, the switch 70 is opened.

FIG. 12 illustrates the control gate and source being connected together by the switch 70, and a resistor 72 connected between the source and substrate of the cell 60 to generate the 0.5 V bias voltage. A switch 74 can be provided to short out the resistor 72 when the source is to be connected to the substrate. Alternatively, a switch (not shown) can be connected in series with the resistor 72 and/or provided in combination with the switch 74 so that the source of the cell 60 can be selectively connected to the substrate directly or through the resistor 72. This arrangement enables an additional resistor and switch to be connected in parallel with the resistor 72 and associated switch to provide a different bias voltage during overerase correction as described with reference to FIG. 10.

It is further within the scope of the present invention to apply a back bias voltage to the source and gate in the form of a negative voltage applied to the substrate or body. In an arrangement in which NMOS transistor cells, for example, are formed in P-type wells in a semiconductor substrate, a negative voltage can be applied to the P-wells. For APDE, the source and gate can be grounded, and –0.5 V applied to the substrate or P-well. This provides a higher horizontal electrical field for more effective APDE. For programming, the source can be grounded and –0.25 V applied to the substrate or P-well.

In summary, the present invention overcomes the limitations of the prior art and enables an APDE operation to be operatively performed which tightens the threshold voltage distribution during overerase correction and programming in a flash EEPROM after erase. In addition, background leakage current in the cells during overerase correction and programming is substantially eliminated, thereby reducing the power requirements.

Various modifications will become possible for those skilled in the art after receiving the teachings of the present disclosure without departing from the scope thereof. For example, although the invention has been described as being applied to the memory 10 as illustrated in FIG. 4, it is also applicable to a memory such indicated at 16 in FIG. 5 which in which the cells are arranged in a plurality of banks.

In this case, the erase and overerase correction operations are performed independently and sequentially for the cell banks. As viewed in FIG. 5, the erase and overerase correction operations are first performed on the bank 18 with the bank select line $BS_1$ high and the select transistors $S_0$ to $S_n$ turned on, and then the erase and overerase correction operations are performed on the bank 20 with the bank select line $BS_2$ high and the select transistors $S_0'$ to $S_n'$ turned on. The bank 20 is turned off (bank select line $BS_2$ low) while the bank 18 is being accessed and the bank 18 is turned off (bank select line $BS_1$ low) while the bank 20 is being accessed.

Alternatively, the memory in FIG. 5 can be erased, programmed, and erase corrected in parallel, both banks being pulsed at the same time. In this case, pulses are applied to corresponding cells or sets of cells in the banks in parallel.

We claim:

1. A method for operating a flash Electrically-Erasable Programmable Read-Only Memory (EEPROM) which includes a semiconductor substrate and a plurality of field effect transistor memory cells each having a source, drain, floating gate and control gate formed on the substrate, comprising the steps of:
   (a) applying an operational pulse to a cell; and
   (b) applying a bias voltage between the source and substrate of the cell while the operational pulse is being applied thereto, the bias voltage having a value selected to reduce leakage current in the cell.

2. A method as in claim 1, in which step (b) comprises further applying a voltage which is substantially equal to the bias voltage to the control gate of the cell.

3. A method as in claim 1, in which the operational pulse which is applied in step (a) is an overerase correction pulse.

4. A method as in claim 3, in which step (b) comprises further applying a voltage which is substantially equal to the bias voltage to the control gate of the cell.

5. A method as in claim 1, in which step (a) comprises applying a voltage to the control gate of the cell which is higher than the bias voltage.

6. A method as in claim 1, in which the operational pulse which is applied in step (a) is a programming pulse.

7. A method as in claim 6, in which step (a) comprises applying a voltage to the control gate of the cell which is higher than the bias voltage.

8. A method as in claim 1, in which:
   the cells are arranged in an array of rows and columns;
   the control gates of cells in rows are connected to respective wordlines;
   the drains of cells in columns are connected to respective bitlines;
   step (a) comprises applying the operational pulse to a selected bitline; and
   step (b) comprises applying the bias voltage to the sources of all cells connected to the selected bitline.

9. A method as in claim 8, in which:
   the memory further comprises;
      pass transistors connected between a voltage source and the bitlines respectively; and
      a bitline driver for turning a selected pass transistor on or off; and
   step (a) comprises controlling the bitline driver to apply a signal to turn the selected pass transistor on.

10. A method as in claim 1, in which:
    the operational pulse which is applied in step (a) is an overerase correction pulse; and
    the method further comprises the step of:
       (c) applying a programming pulse to the cell.

11. A method as in claim 10, further comprising the step of:
    (d) applying a bias voltage between the source and substrate of the cell while the programming pulse is being applied thereto, the bias voltage having a value selected to substantially eliminate leakage current in the cell.

12. A method as in claim 11, in which step (c) comprises applying a voltage to the control gate of the cell which is higher than the bias voltage applied in step (d).

13. A method as in claim 10, in which step (b) further comprises applying a voltage which is substantially equal to the bias voltage applied in step (a) to the control gate of the cell.

14. A method as in claim 1, in which step (b) comprises connecting electrical resistance between the source of the cell and the substrate.

15. A method as in claim 1, in which step (b) comprises grounding the substrate and applying a positive voltage to the source.

16. A method as in claim 1, in which step (b) comprises grounding the source and applying a negative voltage to the substrate.

17. A flash Electrically-Erasable Programmable Read-Only Memory (EEPROM), comprising:
    a semiconductor substrate;
    a plurality of field effect transistor memory cells each having a source, drain, floating gate and control gate formed on the substrate;
    a power source for supplying a plurality of voltages; and
    a controller for controlling the power source to apply an operational pulse to a cell, and apply a bias voltage between the source and substrate of the cell while the operational pulse is being applied thereto, the bias voltage having a value selected to reduce leakage current in the cell.

18. A memory as in claim 17, in which the controller further controls the power source to apply a voltage which is substantially equal to the bias voltage to the control gate of the cell.

19. A memory as in claim 17, in which the operational pulse is an overerase correction pulse.

20. A memory as in claim 19, in which the controller further controls the power source to apply a voltage which is substantially equal to the bias voltage to the control gate of the cell.

21. A memory as in claim 17, in which the controller further controls the power source to apply a voltage to the control gate of the cell which is higher than the bias voltage.

22. A memory as in claim 17, in which the operational pulse is a programming pulse.

23. A memory as in claim 22, in which the controller further controls the power source to apply a voltage to the control gate of the cell which is higher than the bias voltage.

24. A memory as in claim 17, in which:
the cells are arranged in an array of rows and columns;
the control gates of cells in rows are connected to respective wordlines;
the drains of cells in columns are connected to respective bitlines;
the controller controls the power source to apply the operational pulse to a selected bitline; and
the controller further controls the power source to apply the bias voltage to the sources of all cells connected to the selected bitline.

25. A memory as in claim 24, in which:
the memory further comprises;
    pass transistors connected between a voltage source and the bitlines respectively; and
    a bitline driver for turning a selected pass transistor on or off; and
the controller further controls the bitline driver to apply a signal to turn the selected pass transistor on.

26. A memory as in claim 17, in which:
the operational pulse is an overerase correction pulse; and
the controller further controls the power source to apply a programming pulse to the cell.

27. A memory as in claim 26, the controller further controls the power source to apply a bias voltage between the source and substrate of the cell while the programming pulse is being applied thereto, the bias voltage having a value selected to substantially eliminate leakage current in the cell.

28. A memory as in claim 27, in which the controller further controls the power source to apply a voltage to the control gate of the cell which is higher than the bias voltage while the programming pulse is being applied thereto.

29. A memory as in claim 26, in which the controller further controls the power source to apply a voltage which is substantially equal to the bias voltage to the control gate of the cell while the overerase correction pulse is being applied thereto.

30. A memory as in claim 17, in which controller causes an electrical resistance to be connected between the source of the cell and the substrate for the duration of the operational pulse.

31. A memory as in claim 17, in which the controller controls the power source to ground the substrate and apply a positive voltage to the source.

32. A memory as in claim 17, in which the controller controls the power source to ground the source and apply a negative voltage to the substrate.

33. A memory as in claim 17, in which:
the cells are arranged in a plurality of banks; and
the controller controls the power source to apply the operational pulse to corresponding cells in the banks in parallel.

* * * * *